(12) United States Patent
Kang et al.

(10) Patent No.: US 7,804,097 B2
(45) Date of Patent: Sep. 28, 2010

(54) LIQUID CRYSTAL DISPLAY DEVICE

(75) Inventors: Shin Tack Kang, Yongin-si (KR); Jeong Il Kim, Incheon (KR); Jong Hyuk Lee, Seoul (KR); Yu Jin Kim, Asan-si (KR); Hyang Shik Kong, Cheonan-si (KR); Myung Koo Hur, Cheonan-si (KR); Sung Man Kim, Seoul (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 686 days.

(21) Appl. No.: 11/562,296

(22) Filed: Nov. 21, 2006

(65) Prior Publication Data

US 2007/0197019 A1    Aug. 23, 2007

(30) Foreign Application Priority Data

Feb. 6, 2006    (KR) .................. 10-2006-0011112

(51) Int. Cl.
*G02F 1/13*    (2006.01)
*H03K 19/094*    (2006.01)

(52) U.S. Cl. ............... 257/72; 257/390; 257/E25.032; 257/E27.133; 257/E29.117; 257/E29.273; 257/E29.32; 438/30; 438/128; 438/149

(58) Field of Classification Search .............. 257/57, 257/59, 72, 83, 252–254, 257–258, 290, 257/351, 368, 392, E31.058, E31.063, E31.115, 257/E25.032, E27.133–E27.139, 223, 227, 257/291, 292, 439, 443, 655, E27.1, E27.125, 257/E27.112, E29.117, E29.145, E29.147, 257/E29.151, E29.182, E29.202, E29.273–E29.299, 257/E29.314, E29.32, E23.016; 438/22, 438/24, 30, 48, 128, 149, 151, 157, 161, 438/283; 428/1.1–1.62; 252/299.01–299.7

See application file for complete search history.

(56) References Cited

U.S. PATENT DOCUMENTS

| | | | |
|---|---|---|---|
| 6,255,130 B1 * | 7/2001 | Kim | 438/30 |
| 7,205,571 B2 * | 4/2007 | Ahn et al. | 257/72 |
| 7,439,544 B2 * | 10/2008 | Lin et al. | 257/72 |
| 7,580,108 B2 * | 8/2009 | Chang et al. | 349/192 |
| 2003/0043318 A1 * | 3/2003 | Kim | 349/106 |
| 2003/0222311 A1 * | 12/2003 | Kim | 257/347 |
| 2004/0256619 A1 * | 12/2004 | Nomura et al. | 257/66 |
| 2006/0289866 A1 * | 12/2006 | Araki | 257/59 |
| 2007/0134858 A1 * | 6/2007 | Ryu et al. | 438/149 |
| 2007/0152242 A1 * | 7/2007 | Yoo et al. | 257/204 |
| 2008/0117344 A1 * | 5/2008 | Kim et al. | 349/39 |
| 2009/0027601 A1 * | 1/2009 | Kim | 349/106 |
| 2010/0045918 A1 * | 2/2010 | Han et al. | 349/149 |

FOREIGN PATENT DOCUMENTS

CN    1638019    7/2005

OTHER PUBLICATIONS

English Abstract for Publication No. CN1638019.

* cited by examiner

*Primary Examiner*—W. David Coleman
*Assistant Examiner*—Maliheh Malek
(74) *Attorney, Agent, or Firm*—F. Chau & Associates, LLC (57) ABSTRACT

A liquid crystal display device comprises at least two insulating layers formed on a first conductive layer, a second conductive layer formed between the at least two insulating layers, a first contact hole penetrating an upper insulating layer of the at least two insulating layers on the second conductive layer, a second contact hole penetrating the at least two insulating layers and exposing a portion of the first conductive layer, and a contact part comprising a bridge electrode formed of a third conductive layer for connecting the first and second conductive layers through the first and second contact holes. The second contact hole comprises an internal hole penetrating the at least two insulating layers and an external hole surrounding the internal hole forming in the upper insulating layers.

8 Claims, 11 Drawing Sheets

LIQUID CRYSTAL DISPLAY DEVICE

CROSS-REFERENCE TO RELATED APPLICATION

This application claims priority to Korean Patent Application No. 2006-0011112, filed on Feb. 6, 2006, in the Korean Intellectual Property Office, the disclosure of which is herein incorporated by reference in its entirety.

BACKGROUND OF THE INVENTION

1. Field of the Invention

The present invention relates to a liquid crystal display (LCD) device, and more particularly, to an LCD device using a slit mask capable of substantially preventing the formation of a backward sloping surface of an insulating layer, and a manufacturing method thereof.

2. Description of Related Art

An LCD device displays an image by controlling light transmittance of liquid crystal having dielectric anisotropy using an electric field. The LCD device is formed by assembling a color filter substrate on which a color filter array is formed and a thin film transistor (TFT) substrate on which a TFT array is formed, with liquid crystal disposed between the color filter array and the TFT array. A common electrode to which a common voltage is supplied is formed on the entire surface of the color filter substrate. A plurality of pixel electrodes to which data signals are individually supplied is formed in a matrix format on the TFT substrate. TFTs for individually driving the plurality of pixel electrodes, gate lines for controlling the TFTs, and data lines for supplying a data signal to the TFTs are also formed on the TFT substrate.

The TFT substrate has a multi-layered structure in which a plurality of conductive layers and insulating layers are stacked. For example, a first conductive layer for forming the gate lines, gate electrodes of the TFTs, etc., a second conductive layer for forming the data lines, source and drain electrode of the TFTs, etc., and a third conductive layer for forming the pixel electrodes, etc., are stacked on the TFT substrate with insulating layers disposed between the conductive layers.

A plurality of contact parts for connecting the first and second conductive layers by using a bridge electrode formed of the third conductive layer exist on the TFT substrate. The bridge electrode connects the first and second conductive layers through a first contact hole exposing the first conductive layer by penetrating at least two insulating layers and through a second contact hole exposing the second conductive layer by penetrating at least one insulting layer. An edge of an upper insulating layer of the at least two insulating layers penetrated by the first contact hole may have a backward sloping surface due to over-etching. The backward sloping surface may result in an open defect of the bridge electrode through the first contact hole. Even if the bridge electrode is not opened, moisture may penetrate through an unfastened gap of the upper and lower insulating layers and progressively increases the resistance of the bridge electrode, thereby lowering picture quality.

SUMMARY OF THE INVENTION

An LCD device according to an embodiment of the present invention comprises at least two insulating layers formed on a first conductive layer, a second conductive layer formed between the at least two insulting layers, a first contact hole penetrating an upper insulating layer of the at least two insulating layers and exposing a portion of the second conductive layer, a second contact hole exposing penetrating the at least two insulating layers and exposing a portion of the first conductive layer, and a contact part comprising a bridge electrode formed of a third conductive layer for connecting the first and second conductive layers through the first and second contact holes, wherein the second contact hole comprises an internal hole penetrating the at least two insulating layers and an external hole surrounding the internal hole and formed in the upper insulating layer. The internal hole of the second contact hole and the external hole of the second contact hole are separated from each other by a given distance. The first contact hole and the external hole of the second contact hole have a gently sloping surface as compared to a sloping surface of the internal hole of the second contact hole. The external hole of the second contact hole is further extended toward the first contact hole than in another direction. A sloping surface of the external hole adjacent to the first contact hole is more gently formed than the other sloping surfaces of the external hole.

The contact part is formed on a TFT substrate comprising an image display unit consisting of a plurality of subpixels and comprising a driving circuit for driving the image display unit.

The image display unit comprises a pixel electrode formed in a subpixel region, a TFT connected to the pixel electrode, a gate line for controlling the TFT, and a data line for supplying data to the TFT, and wherein the driving circuit comprises a gate driving circuit for driving the gate line.

The first conductive layer comprises a gate metal layer formed on an insulating substrate, the second conductive layer comprises a source/drain metal layer formed on a lower insulating layer of the at least two insulating layers covering the gate metal layer, and the third metal layer comprises a transparent conductive layer formed on the upper layer of the at least two insulating layers covering the source/drain metal layer, wherein the lower insulating layer may be a gate insulating layer and the upper insulating layer may be a passivation layer.

The source/drain metal layer comprises single or multiple metal layers in which the molybdenum layer may be connected to the bridge electrode. The image display unit further comprises a storage line formed of the gate metal layer, and wherein the drain electrode that is formed of the source/drain metal layer and is extended from the TFT to overlap the storage line with the gate insulating layer disposed therebetween and is connected to the pixel electrode formed of the transparent conductive layer through a third contact hole penetrating the passivation layer.

According to still another embodiment of the present invention, a method of manufacturing an LCD device comprises the steps of forming a first conductive layer on an insulting substrate, forming a second conductive layer on the first conductive layer, and at least two insulating layers with the second conductive layer disposed therebetween, forming a first contact hole penetrating an upper insulating layer of the at least two insulating layers and exposing a portion of the second conductive layer, forming a second contact hole penetrating the at least two insulating layers and exposing a portion of the first conductive layer, and forming a bridge electrode formed of a third conductive layer for connecting the first and second conductive layers through the first and second contact holes, wherein the second contact hole comprises an internal hole penetrating the at least two insulating layers and an external hole surrounding the internal hole and formed in the upper insulating layer.

Forming the first and second contact holes comprises the steps of forming a photoresist on the upper insulating layer, forming a photoresist pattern by exposing and developing the photoresist by using a diffraction exposure mask or a half-tone mask, forming the internal hole of the second contact hole to penetrate only an upper insulating layer of the at least two insulating layers by a first etching process through the photoresist pattern, and forming the first contact hole and the external hole of the second contact hole penetrating the upper insulating layer by a second etching process through the photoresist pattern, and exposing the first conductive layer by extending the internal hole to penetrate a lower insulating layer of the at least two insulating layers. The first contact hole and the external hole of the second contact hole are formed in regions corresponding to a diffraction exposure part of the diffraction exposure mask or a half-tone transmission part of the half-tone mask. The method further comprises ashing the photoresist pattern between the first and second etching process.

The diffraction exposure part of the diffraction exposure mask comprises a plurality of slits formed substantially parallel to a length of the first and second contact holes. At least one of a line width, a gap and a pitch of the plurality of slits is decreased toward an outer side from a center of the first and second contact holes. The plurality of slits comprises at least one end having a decreased line width. First slits among the plurality of slits corresponding to the first contact hole and second slits among the plurality of slits corresponding to the second contact hole are separated from each other, and the second slits are connected to a transmission part corresponding to the internal hole of the second contact hole. The first slits overlap a portion of the second conductive layer, and the second slits overlap a portion of the first conductive layer and do not overlap the second conductive layer.

BRIEF DESCRIPTION OF THE DRAWINGS

Embodiments of the present invention will become more apparent from the following detailed description when taken in conjunction with the accompanying drawings in which.

DETAILED DESCRIPTION OF PREFERRED EMBODIMENTS

Exemplary embodiments of the present invention will now be described with reference to FIGS. 1 to 11.

Figure 1:
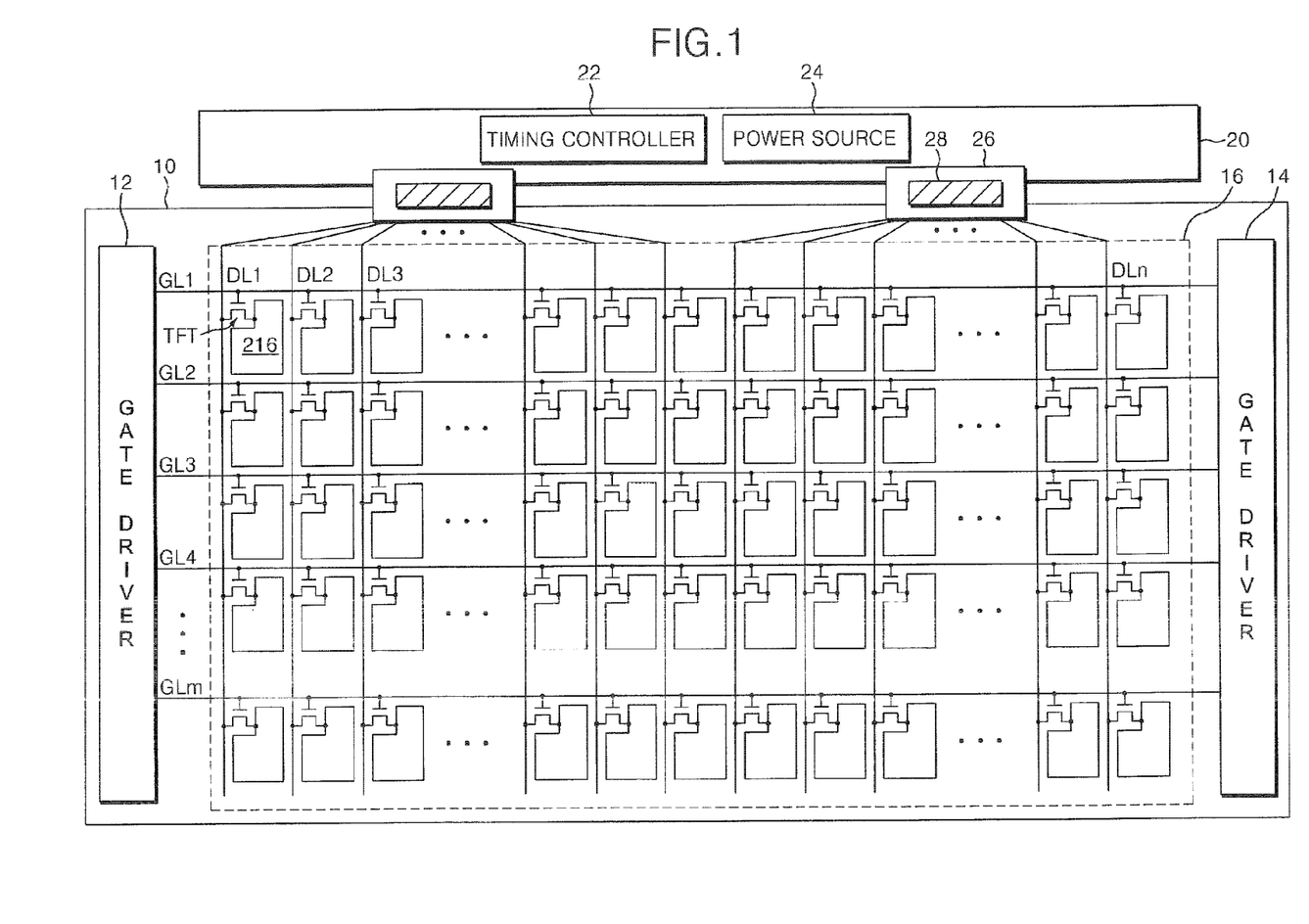
FIG. 1 is a diagram schematically showing an LCD device according to an exemplary embodiment of the present invention.

FIG. 1 is a diagram schematically showing an LCD device according to an exemplary embodiment of the present invention.

The LCD device shown in FIG. 1 comprises an image display unit 16, an LCD panel 10 in which gate drivers 12 and 14 for driving gate lines of the image display unit 16 are formed. The LCD device comprises a circuit film 26 that mounts a data integrated circuit (IC) 28 for driving data lines of the image display unit 16 thereon. The circuit film 26 is connected between a printed circuit board (PCB) 20 and the LCD panel 10. The LCD device comprises a timing controller 22 and a power source 24 that are mounted on the PCB 20. In the LCD panel 10, a color filter substrate is omitted and only a TFT substrate is shown for convenience of explanation.

In the image display unit 16 of the LCD panel 10, gate lines GL1 to GLm and data line DL1 to DLn are formed in a matrix structure, and TFTs and pixel electrodes 216 are formed in subpixel regions defined by the matrix structure. Each of the TFTs supplies a data signal from one of the data lines DL1 to DLn to a pixel electrode 216 in response to a scan signal from one of the gate lines GL1 to GLm. The pixel electrode 216 forms an electric field together with a common electrode of the color filter substrate according to the supplied data signal, thereby controlling the liquid crystal on a subpixel basis to display an image.

Figure 2:
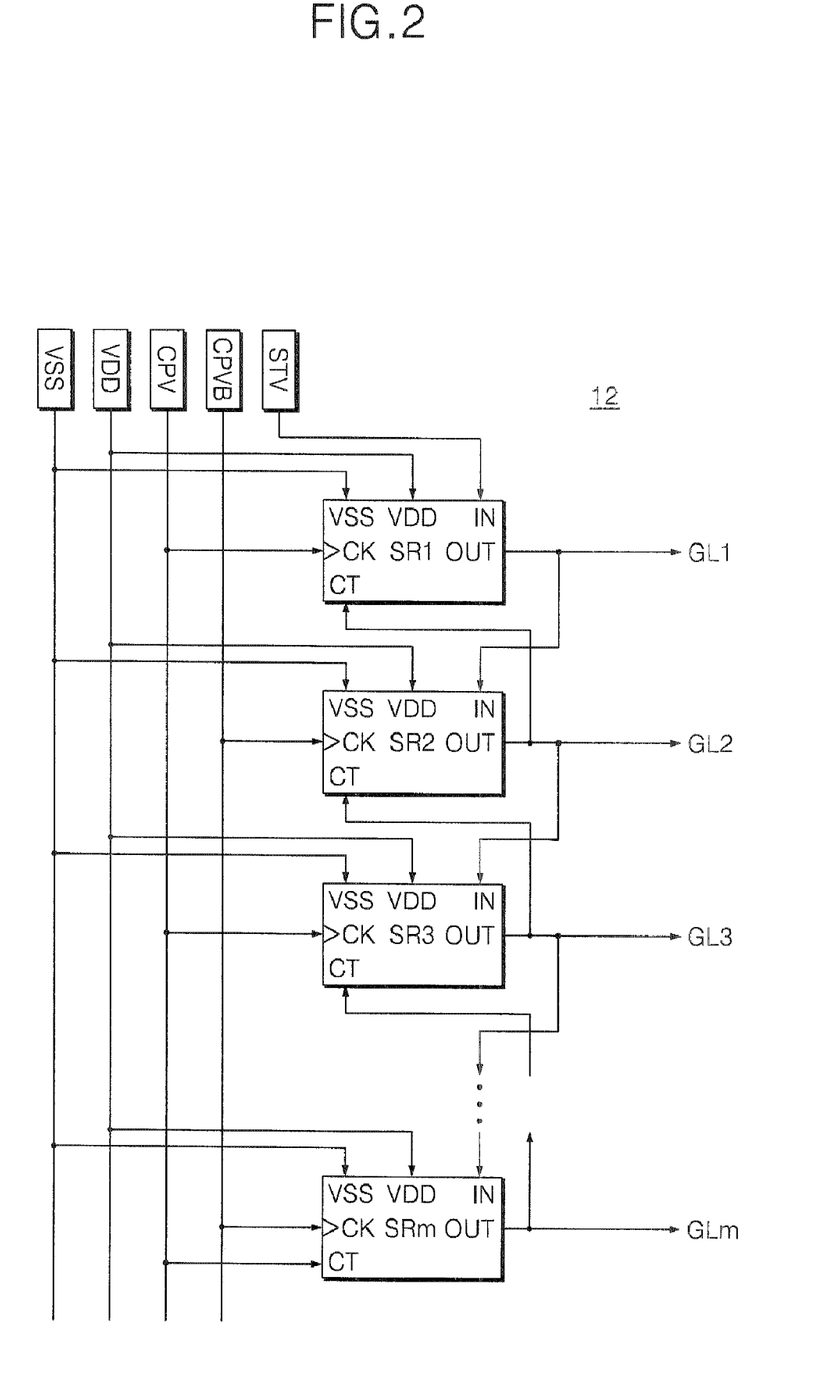
FIG. 2 is an internal block diagram of the gate driver shown in FIG. 1.
Figure 3:
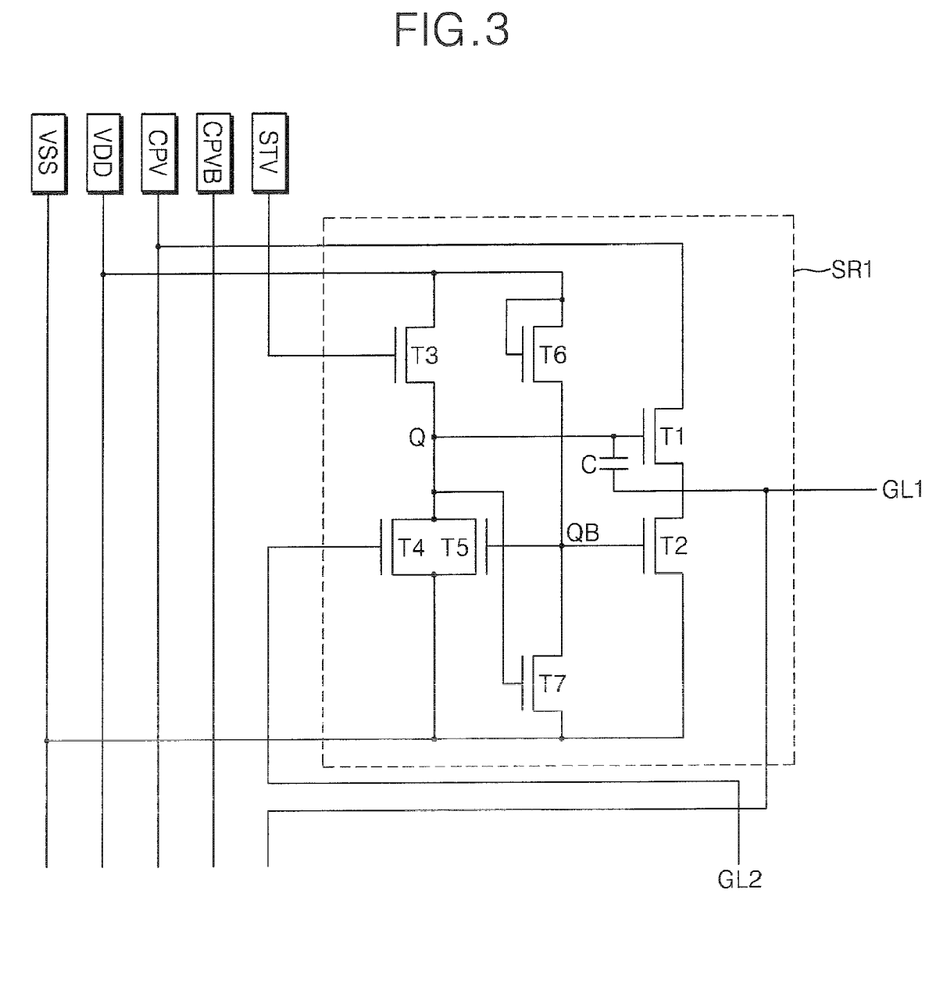
FIG. 3 is a detailed circuit diagram of the first shift register shown in FIG. 2.

The gate drivers 12 and 14 are formed at the outside of both sides of the image display unit 16, in a non-display region located at outer sides of the LCD panel 10, and drive the gate lines GL1 to GLm sequentially. For example, the gate drivers 12 and 14 drive the gate lines GL1 to GLm simultaneously at both sides of the LCD panel 10 or drive odd gate lines GL1, GL3, . . . , and even gate lines GL2, GL4, . . . , respectively. Each of the gate drivers 12 and 14 comprises a plurality of shift registers SR1 to SRm for individually driving the gate lines GL1 to GLm as shown in FIG. 2. Each of the shift resigners SR1 to SRm comprises a plurality of TFTs T1 to T7 as shown in FIG. 3. The gate drivers 12 and 14 are formed on the TFT substrate, together with the TFTs of the image display unit 16, and a plurality of signal lines and electrodes.

Each of a plurality of data ICs 28 for driving the data lines DL1 to DLn of the image display unit 16 is mounted on a corresponding circuit film 26. The circuit films 26 are attached between the LCD panel 10 and the PCB 20 through anisotropic conductive films (ACFs). Tape carrier packages (TCPs) or chip-on-films (COFs) may be used as the circuit films 26 for mounting the data ICs 28. Alternatively, the data ICs 28 may be directly mounted on the TFT substrate of the LCD panel 10 by a chip-on-glass (COG) method without using the circuit films 26. The data ICs 28 convert digital data from the timing controller 22 into an analog data signal by using a gamma voltage from a gamma voltage generator (not shown) and supply the analog data signal to the data lines DL1 to DLn during each horizontal period while the gate lines GL1 to GLm of the image display unit 16 are driven.

The timing controller 22 mounted on the PCB 20 controls the data ICs 28 and the gate drivers 12 and 14. A video data signal and a plurality of data control signals generated from the timing controller 22 are supplied via the PCB 20 and the circuit films 26 to each of the data ICs 28. A plurality of gate control signals generated from the timing controller 22 is supplied to the gate drivers 12 and 14 via the PCB 20, the circuit films 26, and the TFT substrate of the LCD panel 10. The power source 24 generates a plurality of driving voltages needed for driving the data ICs 28, the gate drivers 12 and 14, and the LCD panel 10.

FIG. 2 is an internal block diagram of the gate driver shown in FIG. 1.

Referring to FIG. 2, each of the gate drivers 12 and 14 comprises the plurality of shift register SR1 to SRm for driving the plurality of gate lines GL1 and GLm, respectively.

Output terminals OUT of the plurality of shift registers SR1 to SRm are respectively connected to the plurality of gate lines GL1 to GLm. A start pulse STV from the timing controller 22 is supplied to an input terminal IN of the first shift register SR1. A scan signal of the gate line of a preceding stage is supplied to an input terminal IN of each of the second to $m^{th}$ shift registers SR2 to SRm. A high potential voltage VDD and a low potential voltage VSS from the power source 24 are respectively supplied to power terminals VDD and VSS of each of the shift registers SR1 to SRm. A clock CPV from the timing controller 22 is supplied to a clock terminal CK of each of the odd shift registers SR1, SR3, . . . , and an inversion clock CPVB form the timing controller 22 is supplied to a clock terminal CK of each of the even shift register SR2, SR4, . . . . The clock CPV and the inversion clock CPVB have opposite phases. A scan signal of the gate line of a next stage is supplied to a control terminal CT of each of the shift registers SR1 to SRm−1. The clock CPV opposite to the inversion clock CPVB supplied to the clock terminal CK is supplied to a control terminal CT of the $m^{th}$ shift register SRm. Therefore, the first shift register SR1 outputs the scan signal to the first gate line GL1 in response to the start pulse STV and the clock CPV. The second to $m^{th}$ shift registers SR2 to SRm sequentially output the scan signals to the second to $m^{th}$ gate lines GL2 to GLm in response to the scan signals of the shift registers of the preceding stages and to the clocks CPV and CPVB. Each of the shift registers SR1 to SRm has the same internal circuit construction.

FIG. 3 is a detailed circuit diagram of the first shift register SR1 shown in FIG. 2.

The first shift register SR1 shown in FIG. 3 comprises a first TFT T1 of a pull-up transistor for outputting the clock CPV to the first gate line GL1 by the control of a node Q, an output buffer comprised of a second TFT T2 of a pull-down transister for outputting the lower potential voltage VSS to the first gate line GL1 by the control of a node QB, and a controller comprised of third to seventh TFTs T3 to T7 for controlling the nodes Q and QB. The first to seventh TFTs T1 to T7 may be formed of as N-type or P-type transistors. Accordingly, the first to seventh TFTs T1 to T7 can be formed as N-type transistors, along with the TFTs of the image display unit 16.

The third TFT T3 causes the node Q to be precharged to the high potential voltage VDD in response to the start pulse STV. The precharged node Q is bootstrapped by a coupling phenomenon of a capacitor C responding to the clock CPV and causes a high voltage of the clock CPV to be output as the scan signal of the first gate line GL1 through the first TFT T1. The fourth and fifth TFTs T4 and T5 discharge the node Q to the low potential voltage VSS in response to the scan signal of the second gate line GL2 and to the node QB, respectively. The sixth TFT T6 is connected to a supplying line of the high potential voltage VDD as a forward diode type and causes the node QB to be precharged to the high potential voltage VDD. The seventh TFTs T7 discharges the node QB to the low potential voltage VSS in response to the node Q. If the node Q is discharged to a low voltage through the fourth and fifth TFTs T4 and T5, the seventh TFT T7 is turned off and the node QB is charged to the high potential voltage VDD. The second TFT T2 is turned on and the scan signal of the first gate line GL1 is discharged to the low potential voltage VSS. The second TFT T2 maintains the turned-on state until the start pulse STV is supplied to the third TFT T3 and the first gate line GL1 maintains the low potential voltage VSS.

The LCD device according to an embodiment of the present invention mounts the gate drivers 12 and 14, each comprising a plurality of TFTs, on the TFT substrate of the LCD panel 10 using amorphous silicon. Since the gate drivers 12 and 14 are formed by a plurality of mask processes together with the image display unit 16 of the TFT substrate, at least three conductive layers are stacked with insulating layers disposed therebetween. Moreover, in the gate drivers 12 and 14, there is a plurality of contact parts for connecting different conductive layers through a bridge electrode. For example, to the gate drivers 12 and 14, there exists a plurality of contact parts for connecting a gate metal layer and a source/drain metal layer with a gate insulating layer disposed therebetween to each other through a bridge electrode formed of a transparent conductive layer on a passivation layer.

Figure 4:
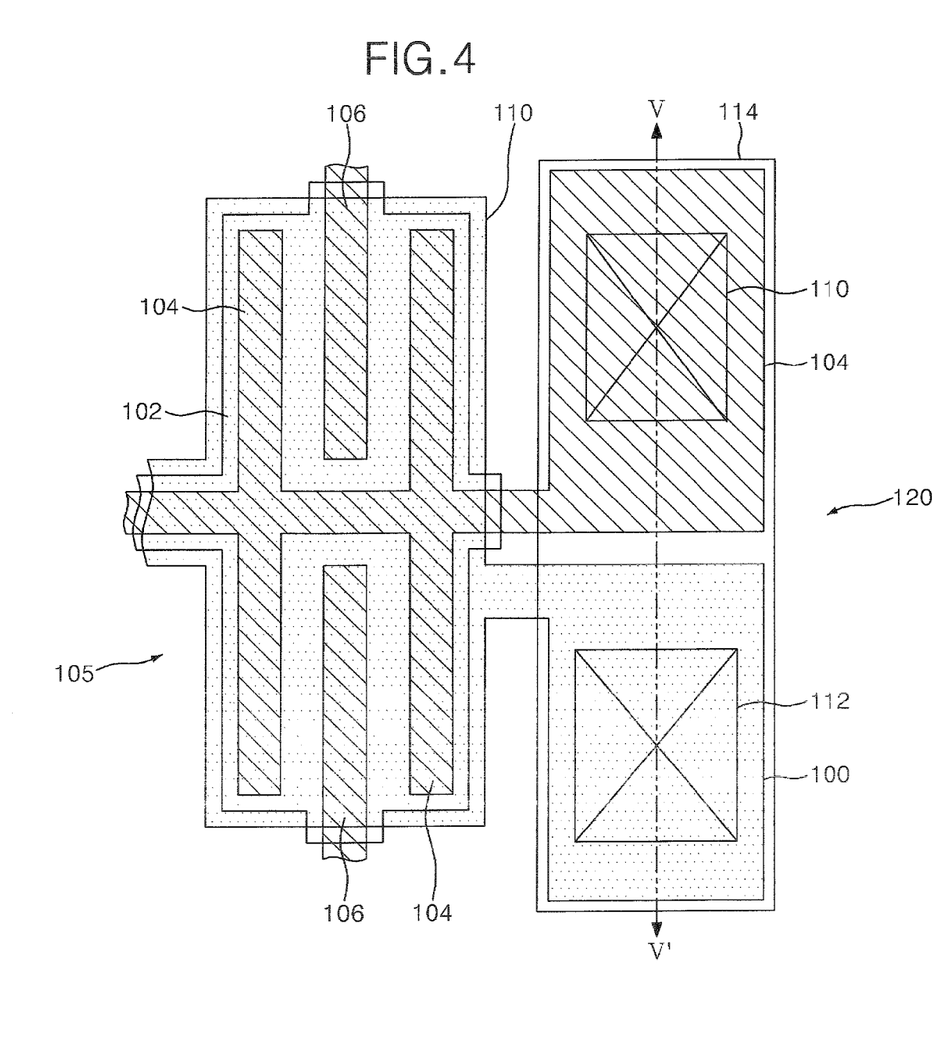
FIG. 4 is a plane view of a contact part within a gate driver according to an exemplary embodiment of the present invention.
Figure 5:
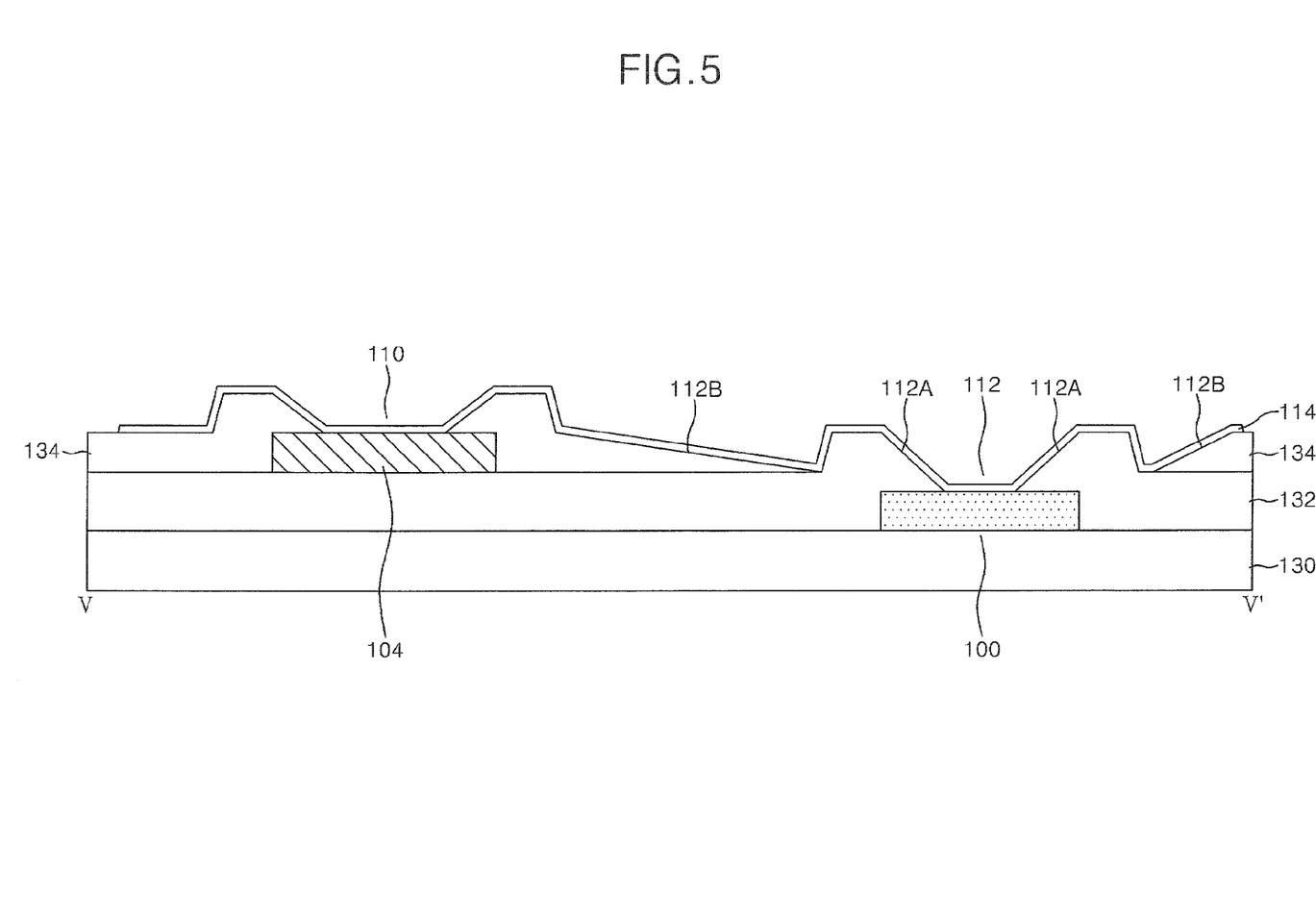
FIG. 5 is a cross-sectional view of the contact part taken along the line V-V' shown in FIG. 4.

FIG. 4 is an enlarged plane view of a contact part 120 of different conductive layers within the gate driver shown in FIG. 1. FIG. 5 is a cross-sectional view of the contact part 120 taken along the line V-V' shown in FIG. 4.

The gate driver shown in FIG. 4 comprises a pair of TFTs 105 connected in parallel and the contact part 120 connected to the pair of TFTs 105. The contact part 120 comprises a bridge electrode 114 for connecting a gate electrode 100 and a source electrode 104, protruding from the pair of TFTs 105. The contact part 120 is not limited to the pair of TFTs 105 and is applicable to all structures in which the gate metal layer and the source/drain metal layer are connected through the bridge electrode on the TFT substrate.

The pair of TFTs 105 comprises a gate electrode 100, a semiconductor layer 102 that overlaps the gate electrode 100 with a gate insulating layer disposed there between. The pair of TFTs 105 comprises a source electrode 104 and a drain electrode 106 that overlap the semiconductor layer 102 and are spaced apart from each other. The source electrode 104 encompasses three sides of the drain electrode 106 that protrudes upwardly and downwardly relative to a center of the semiconductor layer 102 and is separated from the drain electrode 106. Two channels comprised of the semiconductor layer 102 are formed between the source electrode 104 and the drain electrode 106. Each TFT of the pair of TFTs 105 corresponds to any one of the TFTs T1 to T7 shown in FIG. 3.

The contact part 120 comprises the gate electrode 100 and the source electrode 104 protruding from the pair of TFTs 105, first and second contact holes 110 and 112 for exposing the source electrode 104 and the gate electrode 100 respectively, and the bridge electrode 114 for connecting the source electrode 104 and the gate electrode 100 through the first and second contact holes 110 and 112.

Referring to FIG. 5, the gate electrode 100 is formed of a gate metal layer on an insulating substrate 130. A gate insulating layer 132 is formed on the insulating substrate 130 and the gate electrode 100. The source electrode 104 is formed of a source/drain metal layer on the gate insulating layer 132, and a passivation layer 134 is formed on the gate insulating layer 132 and the source electrode 104. The first contact hole 110 penetrates the passivation layer 134 to expose a portion of the source electrode 104, and the second contact hole 112 penetrates the passivation layer 134 and the gate insulating layer 132 to expose a portion of the gate electrode 100. The second contact hole 112 comprises an internal hole 112A penetrating the passivation layer 134 and the gate insulating layer 132 and an external hole 112B penetrating only the passivation layer 134. The external hole 112B is extended to an outer side of the internal hole 112A, only on the passivation layer 134. The external hole 112B has a wider cross section area than the internal hole 112A and closer to the first contact hole 110. The external hole 112B is formed to be relatively wide to encompass the outer side of the internal hole 112A. An edge of the passivation layer 134 forming the external hole 112B is separated from a portion of the gate insulating layer 132 forming the internal hole 112A and has a relatively gently inclination angle as compared to the internal hole 112A. The external hole 112B of the second contact hole 112 is formed by the same mask process as the internal hole 112A, and may be formed together with the first contact hole 110 by using diffraction exposure or semi-transmission to penetrate only the passivation layer 134. The edge of the passivation layer 134 forming the external hole 112B has a sloping surface towards the internal hole 112B. The edge of the passivation layer 134 is substantially prevented from being formed having a sloping surface having a backward direction sway from the internal hole 112B.

The bridge electrode 114 formed of a transparent conductive layer on the passivation layer 134 is connected to the source electrode 104 through the first contact hole 110 and extends along the sloping surface of the external hoe 112B of the second contact hole 112. The bridge electrode 114 is also connected to the gate electrode 100 through the internal hole 112A of the second contact hole 112. The bridge electrode 114 is substantially prevented from being opened by the sloping surface of the passivation layer 134 forming the external hole 112B of the second contact hole 112. The external hole 112B of the second contact hole 112 between the first contact hole 110 and the internal hole 112A of the second contact hole 112 is formed to have the relatively gently inclination angle relative to the portion of the gate insulating layer 132 forming the internal hole 112A as shown in FIG. 5. Therefore, a defect of the bridge electrode 114 caused by the backward sloping surface of the passivation layer 134 from the second contact 112 downward toward the first contact hole 110 is substantially prevented.

Figure 6:
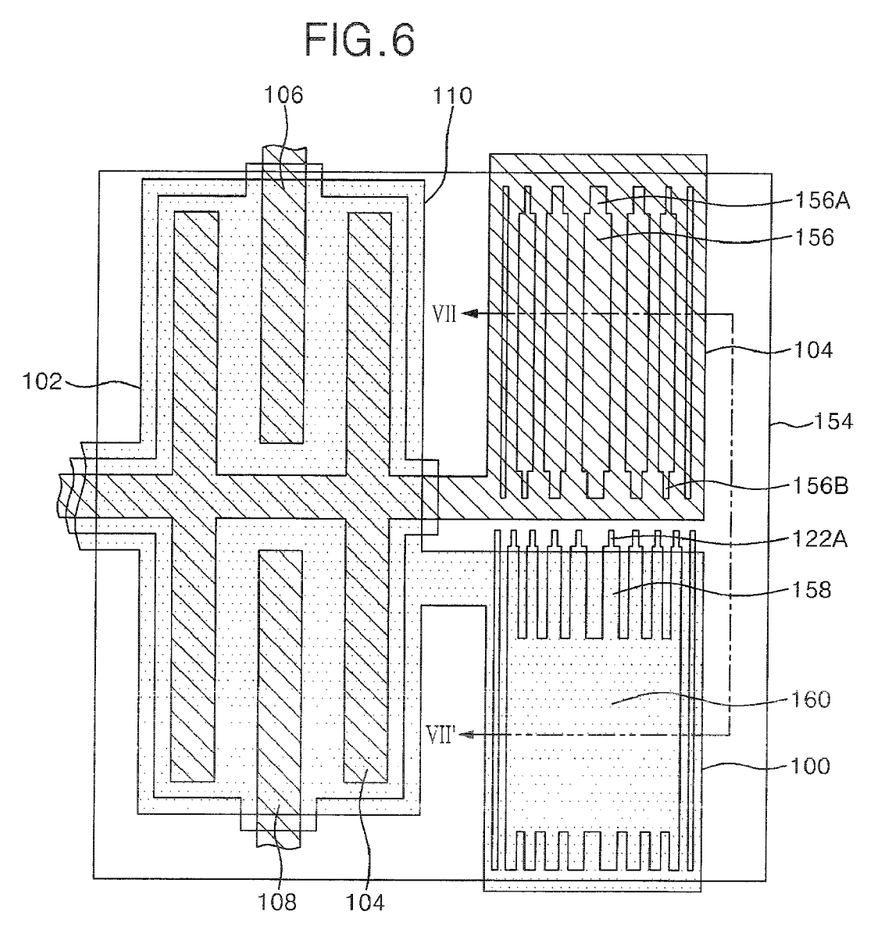
FIG. 6 is a plane view of a diffraction exposure mask used to form a contact hole in a manufacturing method of an LCD device according to an exemplary embodiment of the present invention.
Figure 7:
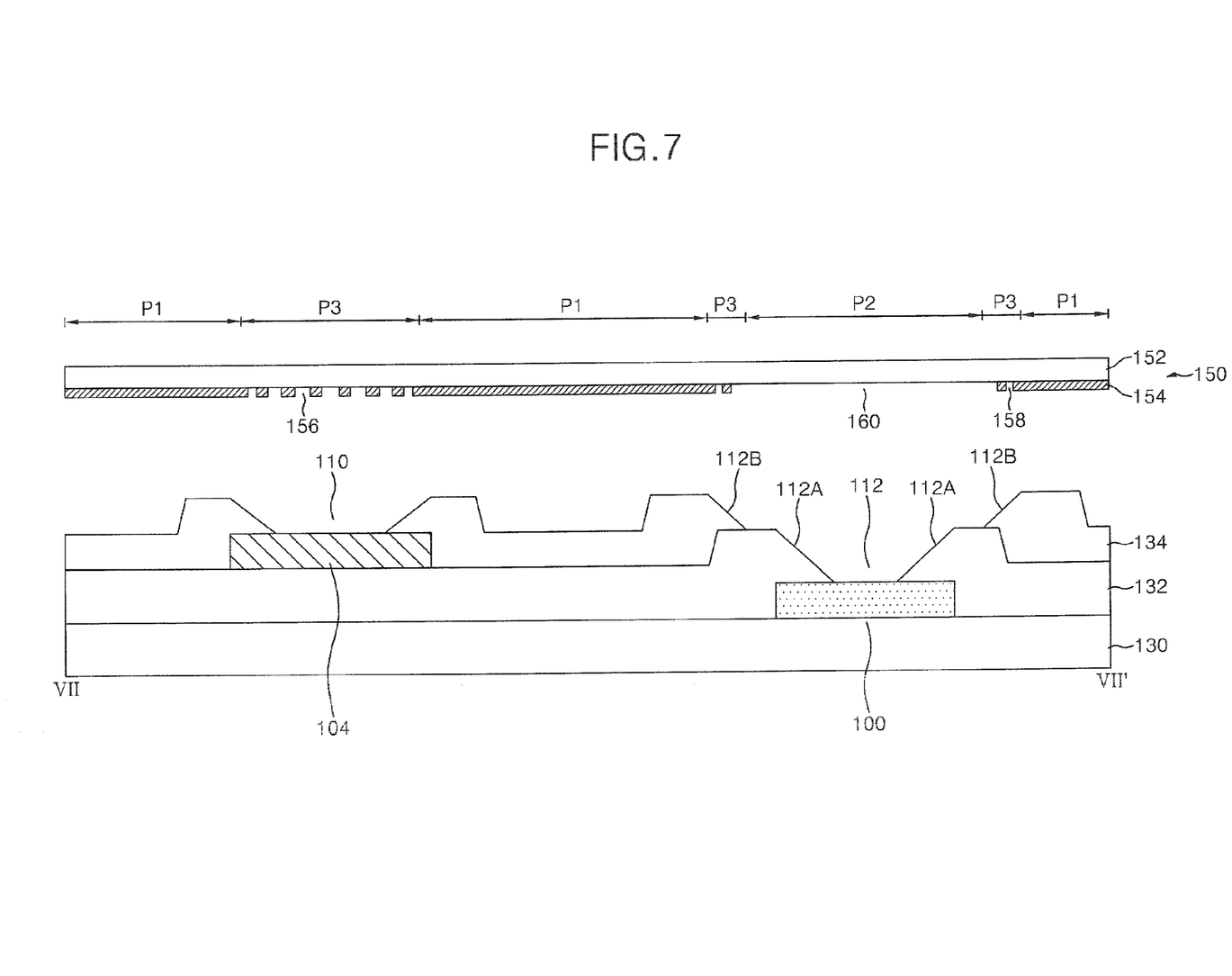
FIG. 7 is a cross-sectional view of the TFT substrate and the diffraction exposure mask taken along the line VII-VII' shown in FIG. 6.
Figure 8:
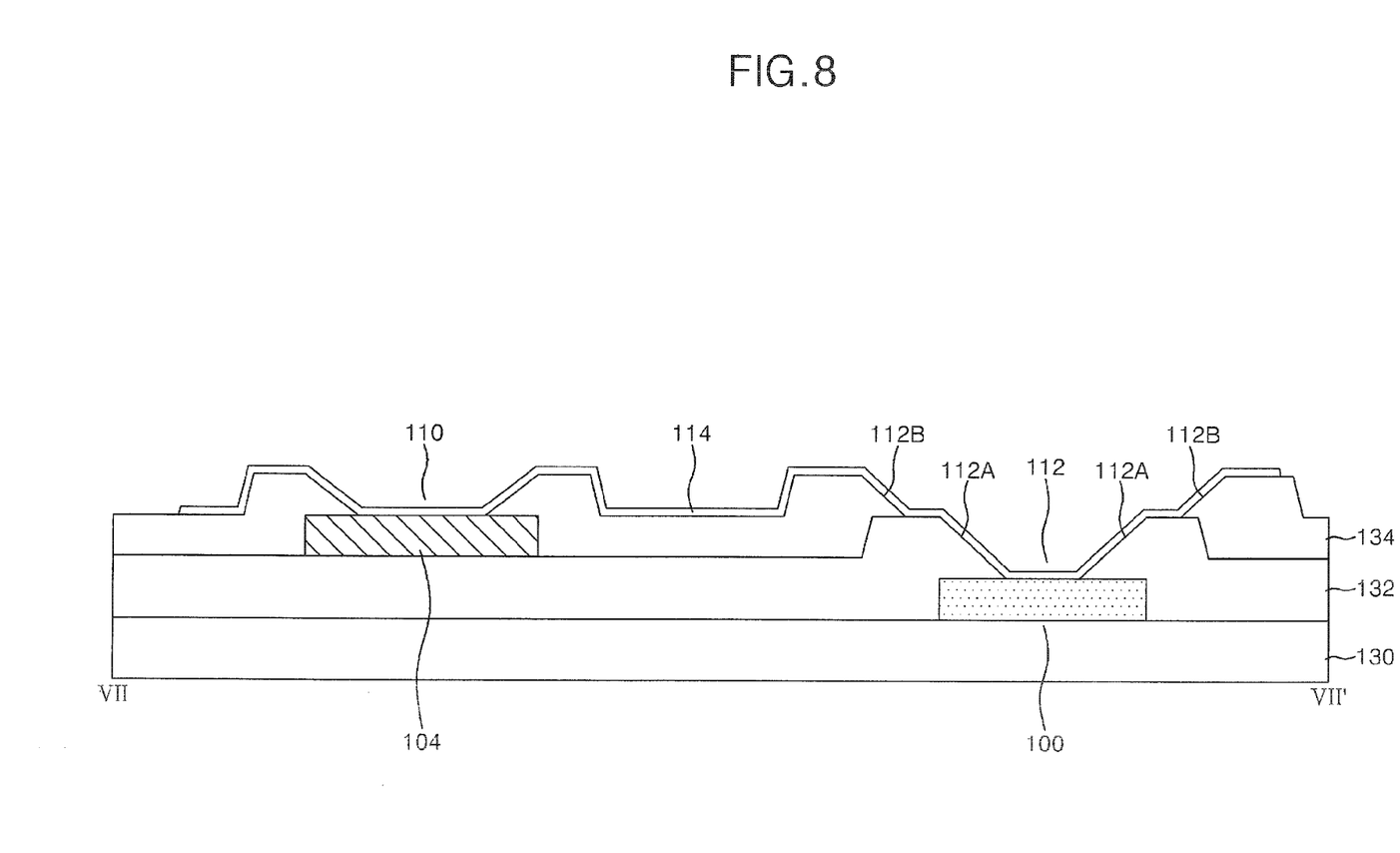
FIG. 8 is a cross-sectional view illustrating a structure in which a bridge electrode is formed on the TFT substrate shown in FIG. 7.

FIG. 6 is a plane view of a diffraction exposure mask used to form a contact hole of the TFT substrate according to an exemplary embodiment of the present invention. FIG. 7 is a cross-sectional view of the TFT substrate and the diffraction exposure mask taken along the line VII-VII' shown in FIG. 6. FIG. 8 is a cross-sectional view of the TFT substrate on which the bridge electrode is formed.

Referring to FIGS. 6 and 7, the gate electrode 100, the source electrode 104 and the drain electrode 106 are formed by a plurality of mask processes before the passivation layer 134 is formed on the TFT substrate.

The gate electrode 100 is formed on the insulating substrate 130 by a first mask process. The gate electrode 100 is formed by forming a gate metal layer on the insulating substrate 130 by a deposition method such as sputtering and patterning the gate metal layer by a photolithography process using a first mask and an etching process. The gate metal layer may be a metal such as molybdenum (Mo), aluminum (Al) and chrome (Cr), or an alloy of these metals in a single or multi-layered structure. For example, the gate metal layer may be formed in a double-layered structure of Al/Mo.

The gate insulating layer 132 is also formed on a portion of the gate electrode 100. The gate electrode 100 is formed on the insulating layer 130. The gate insulating layer 132 is formed by a deposition method such as PECVD (Plasma Enhanced Chemical Vapor Deposition) and then the semiconductor layer 102 is formed having a double-layered structure comprising an amorphous silicon layer and an n+ amorphous silicon layer. The semiconductor layer 102 is patterned by a photolithography process using a second mask and an etching process. The gate insulating layer 132 may be formed of an inorganic insulating material, such as silicon oxide (SiOx) and silicon nitride (SiNx).

The source electrode 104 and the drain electrode 106 are formed on the semiconductor layer 102 by a third mask process. The source electrode 104 and the drain electrode 106 are formed as a source/drain metal layer on the gate insulating layer 132 on which the semiconductor layer 102 is formed by a deposition method such as sputtering. The source/drain metal layer is patterned by a photolithography process using a third mask and an etching process. The n+ amorphous silicon layer exposed between the source electrode 104 and the drain electrode 106 is removed by an etching process, and the n+ amorphous silicon layer under the source electrode 104 and drain electrode 106 serves as an ohmic contact layer. The source/drain metal layer may be formed of a metal such as Mo, Al and Cr, or an alloy of these metals in a single or multi-layered structure. For example, the source/drain metal layer may be formed in a triple-layered structure of Mo/Al/Mo. The semiconductor layer 102, the source electrode 104 and the drain electrode 106 may be formed by a single mask process using a diffraction exposure mask.

By a fourth mask process, the passivation layer 134 is formed on the gate insulating layer 132 on which the source electrode 104 and the drain electrode 106 are formed. Further, the first and second contact holes 110 and 112 are formed in the passivation layer 134. The passivation layer 134 is formed by depositing an inorganic insulating layer, such as SiOx and SiNx, on the gate insulating layer 132 by a deposition method such as PECVD. The passivation layer 134 and the gate insulating layer 132 are patterned by a photolithography process using a fourth mask of a diffraction exposure mask 150 and an etching process, thereby forming the first and second contact holes 110 and 112. The first contact hole 110 and the external hole 112B of the second contact hole 112 penetrate only the passivation layer 134 by the diffraction exposure of the diffraction exposure mask 150 and the passivation layer 134 has a relatively gently sloping surface toward the internal hole 112A. The passivation layer 134 may be deposited at a rapid deposition rate process—since the sloping surface of the passivation layer 134 is not formed by an etching process, the deposition process time of the passivation layer 134 may be shortened and productivity improved. While a half-tone mask having a half-tone transmission part may be used in place of a diffraction exposure part of the diffraction exposure mask 150, only the diffraction exposure mask 150 will be described hereinafter.

The diffraction exposure mask 150 comprises an opaque region P1 in which an opaque pattern 154 is formed on a mask substrate 152, a transmission region P2 in which a transmission hole 160 penetrating the opaque pattern 154 is formed, and a diffraction exposure region P3 in which a plurality of slits 156 and 158 penetrating the opaque pattern 154 is formed. The internal hole 112A of the second contact hole 112 is formed in a region corresponding to the transmission region P2 of the diffraction exposure mask 150. The first contact hole 110 and the external hole 112B of the second contact hole 112 are formed in regions corresponding to the diffraction exposure region P3. The passivation layer 134 is formed in a region corresponding to the opaque region P1. The slits 156 and 158 formed in the diffraction exposure region P3 are designed such that at least any one a width, gap and pitch thereof is gradually decreased toward an outer side of the first and second contact holes 110 and 112 to gradually reduce the amount of exposure. Portions of the passivation layer 134 forming the first contact hole 110 and the external hole 112B of the second contact hole 112 having gently sloping surfaces.

For example, the plurality of slits 156 of the diffraction exposure mask 150 for forming the first contact hole 110 is formed in parallel with a length of the first and second contact holes 110 and 112. The plurality of second slits 158 for forming the external hole 112B of the second contact hole 112 is formed to be longitudinally extended from the transmission hole 160 for forming the internal hole 112A. The first and second slits 156 and 158 are spaced apart from each other, wherein an edge of the source electrode 104 is disposed there between as shown in FIG. 6. The first slits 156 are formed within an area of the source electrode 104 so as not to exceed the area of the source electrode 104. The gate insulating layer 132 under the source electrode 104 is substantially prevented from being undercut by an overetch by an exposure of the edge of the source electrode 104 during an etching process up to the gate insulating layer 132. A middle portion of the first slits 156 have a first width and ends portions 156A and 156B have a second width less than the first width. One or more of the line width, gap and pitch of the first slits 156 is decreased toward an outer side from a center of the first contact hole 110 in a width direction of the first slits 156 so that the portion of the passivation layer 134 forming the first contact hole 110 has a relatively gently sloping surface. Each of the second slits 158 extended from the transmission hole has a third width and end portions 158A thereof opposite the first slit 156 have a forth width less than the third width. One or more of the line width, gap and pitch of the second slits 158 is decreased toward an outer side from a center of the second contact hole 112 in a width direction of the second slits 158 so that the passivation layer 134 encompassing the second contact hole 112 has a relatively gently sloping surface. The second slits 158 may be extended to overlap the edge of the gate electrode 100. The second slits 158 do not extend to overlap the source electrode 104.

A photoresist (not shown) is deposited on the passivation layer 134 and photoresist patterns having different thicknesses are formed in regions corresponding to the opaque region P1 and the diffraction exposure region P3 by exposure and development using the diffraction exposure mask 150. The photoresist pattern corresponding to the diffraction exposure region P3 has a thinner thickness than that corresponding to the opaque region P1. The internal hole 112A of the second contact hole 112 penetrating the passivation layer 134 is formed by a first dry etching process using these photoresist patterns as a mask. Thereafter, the photoresist patterns are ashed to remove the photoresist pattern having a relatively thin thickness, thereby reducing the entire thickness. By a second dry etching process using the remaining photoresist pattern as a mask, the first contact hole 110 and the external hole 112B of the second contact hole 112 penetrating the passivation layer 134 are formed, and the internal hole 112A is extended to penetrate the gate insulating layer 132. The first dry etching process, the ashing process of the photoresist pattern and the second dry etching process may be successively implemented in the same chamber. The first contact hole 110 exposing the source electrode 104 is formed by the second dry etching process, wherein even if the source electrode 104 is formed in a triple-layered structure of Mo/Al/Mo, the upper Mo layer is substantially prevented from being etched. Therefore, the upper Mo layer need not be formed thicker than about 1000 Å to prevent the Al layer from being exposed, and a deposition time can be shortened by lowering the deposition thickness of the upper Mo layer to about a half or under about less than 500 Å, thereby improving productivity. The remaining photoresist pattern is removed by a photoresist strip process.

Referring to FIG. 8, the bridge electrode 114 for connecting the source electrode 104 and the gate electrode 100 thorough the first and second contact holes 110 and 112 is formed by a fifth mask process. The bridge electrode 114 is formed by forming a transparent conductive layer on the passivation layer 134 by a deposition method such as sputtering and patterning the transparent conductive layer by a photolithography process using a fifth mask and an etching process. As the transparent conductive layer, ITO (Indium Tin Oxide), TO (Tin Oxide), IZO (Indium Zinc Oxide), ITZO (Indium Tin Zinc Oxide), ZO (Zinc Oxide) etc., may be used.

The LCD device and the manufacturing method thereof according to an embodiment of the present invention form the first contact hole 110 and the external hole 112B of the second contact hole 112 penetrating the passivation layer 134 by using the diffraction exposure or half-tone mask. The first contact hole 110 and the external hole 112B of the second contact hole 112 are formed by the same mask process as the internal hole 112A of the second contact hole 112 penetrating the passivation layer 134 and the gate insulating layer 132 and the passivation layer 134 has a relatively gently sloping surface. Then an open defect or a progressive open defect of the bridge electrode 114 through the first and second contact holes 110 and 112 is substantially prevented and the deposition process time may be shortened by depositing the passivation layer 134 at a high speed, thereby improving the productivity.

Figure 9:
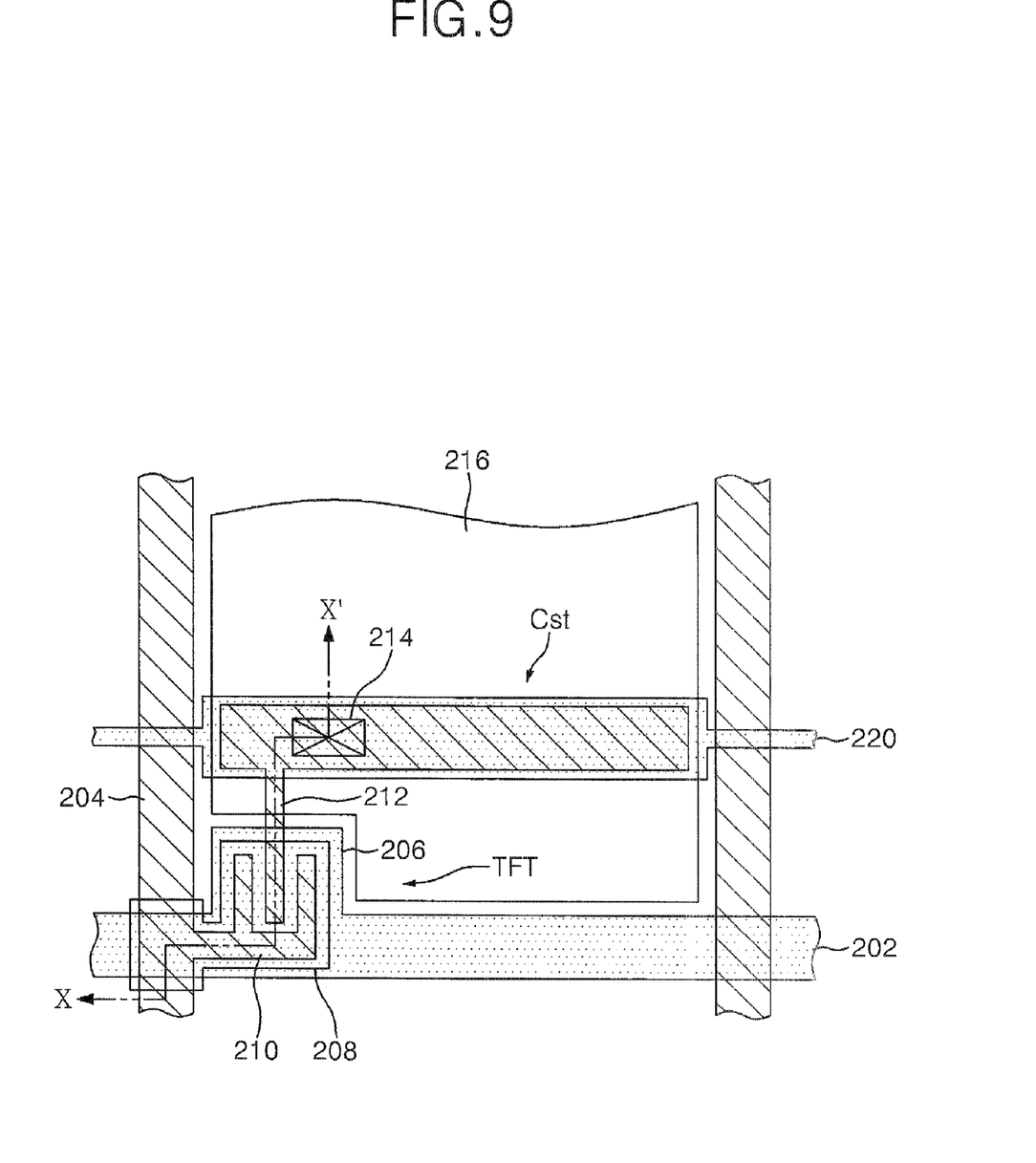
FIG. 9 is a plane view partially illustrating one subpixel in a TFT substrate according to an exemplary embodiment of the present invention.
Figure 10:
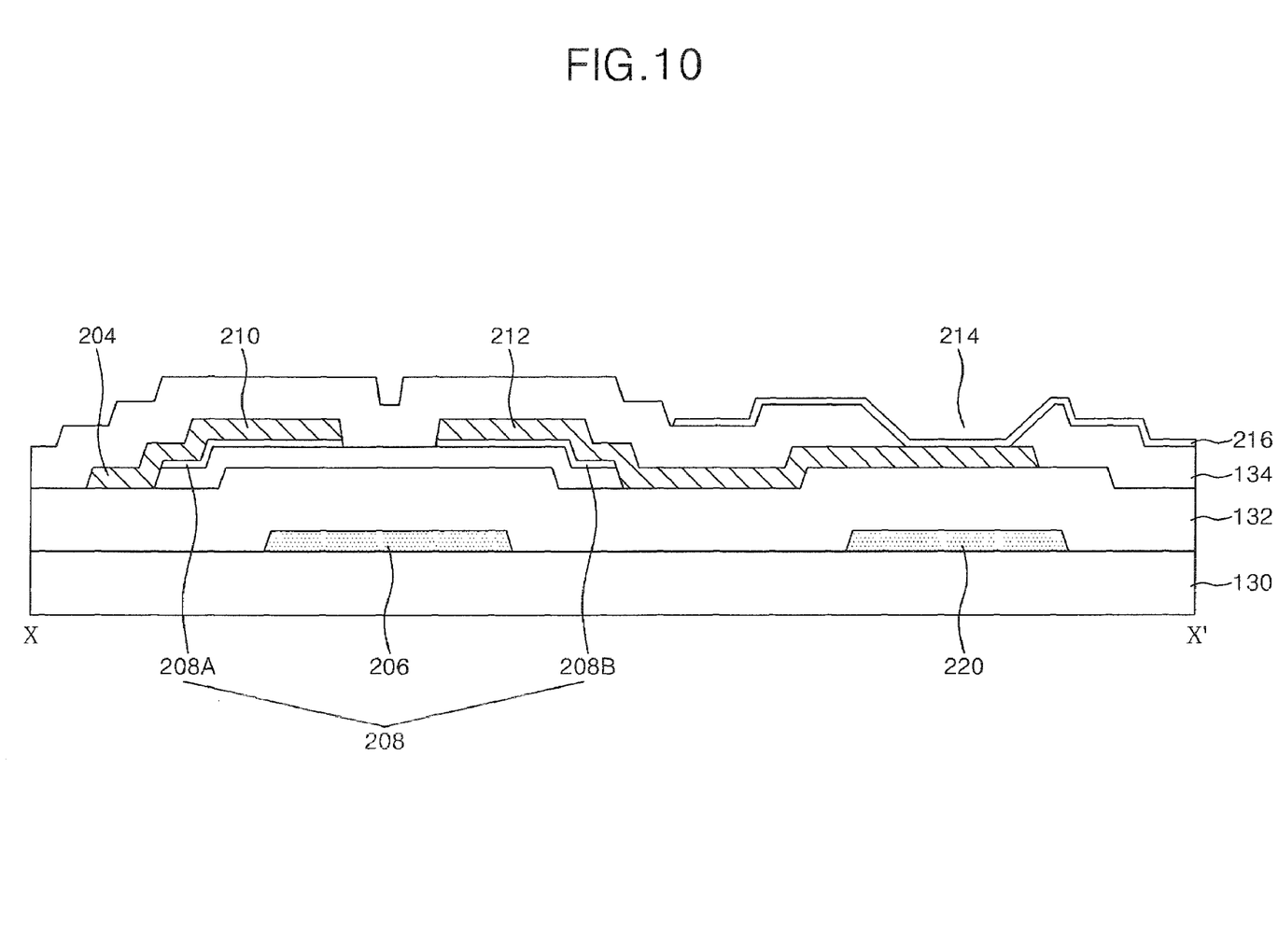
FIG. 10 is a cross-sectional view of the subpixel taken along the line X-X' shown in FIG. 9.
Figure 11:
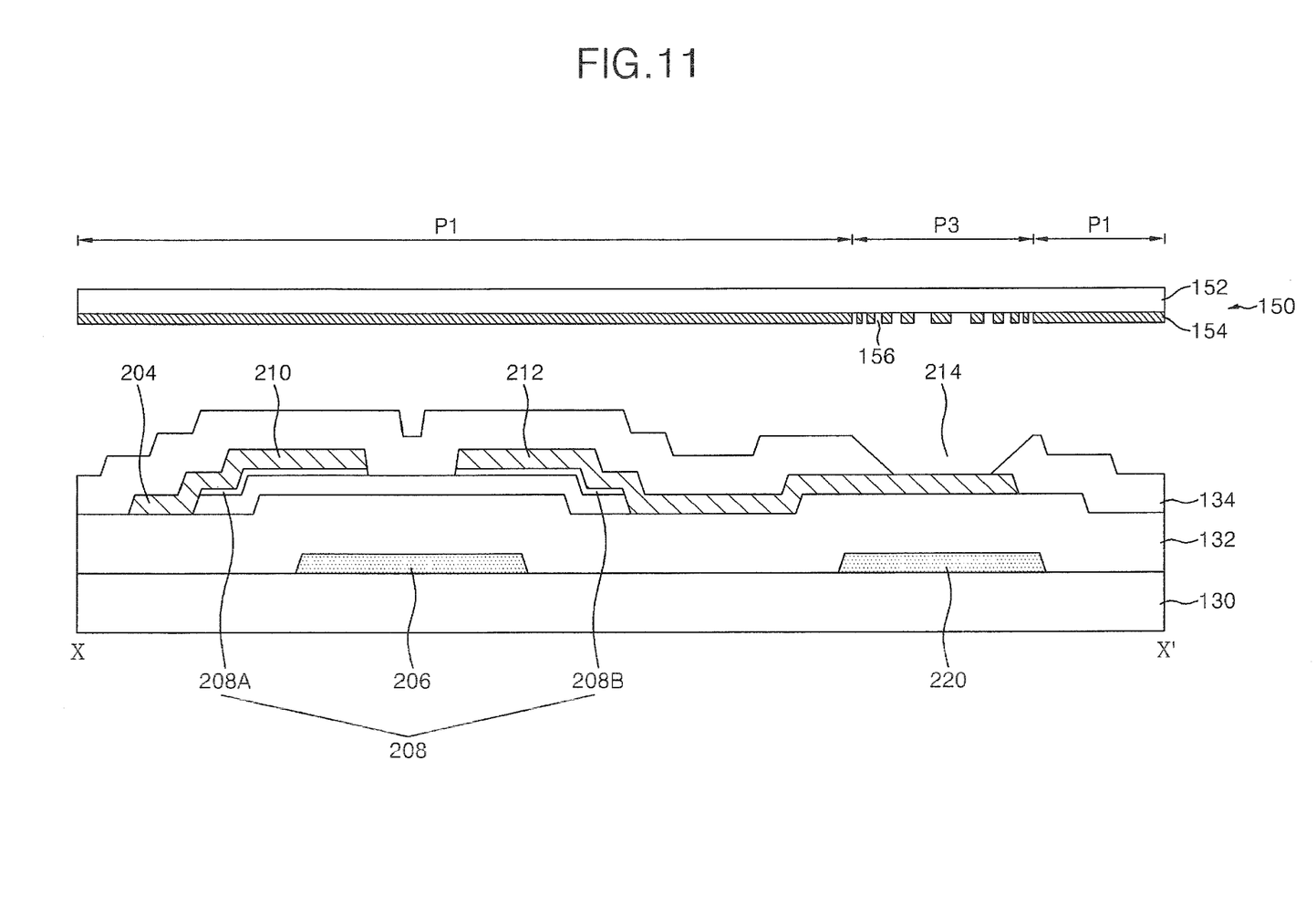
FIG. 11 is a cross-sectional view for describing a method of forming the contact hole shown in FIG. 9.

FIG. 9 is a plane view partially illustrating one subpixel in a TFT substrate according to an exemplary embodiment of the present invention. FIG. 10 is a cross-sectional view of the subpixel taken along the line X-X' shown in FIG. 9. FIG. 11 is a cross-sectional view of a mask for forming the contact hoe shown in FIG. 9.

Referring to FIGS. 9 and 10, a subpixel comprises a pixel electrode 216 formed in a subpixel region defined by an intersection of a gate line 202 and a data line 204, and a TFT connected between the gate line 202, the data line 204 and the pixel electrode 216.

The gate line 202 and the data line 204 are formed on the insulating substrate 130 with a gate insulating layer 132 disposed there between. Each subpixel region is divided by a matrix structure of the gate line 202 and the data line 204. A storage line 220 crosses the data line 204 with the gate insulating layer 132 disposed therebetween on the insulating substrate 130, substantially parallel to the gate line 202.

The TFT comprises a gate electrode 206 comprised in the gate line 202, a drain electrode 210 connected to the data line 204, a source electrode 212 connected to the pixel electrode 216, and a semiconductor layer 208 connected to the drain electrode 210 and to the source electrode 212. The semiconductor layer 208 comprises an active layer 208A for forming a channel between the drain electrode 210 and the drain electrode 212, and an ohmic contact layer 208B for an ohmic contact of each of the active layer 208A, the drain electrode 210 and drain electrode 212.

The pixel electrode 216 is formed on a passivation layer 134 covering the TFT and is connected to the source electrode 212 through a third contact hole 214 penetrating the passivation layer 134. The source electrode 212 is extended from the TFT to form a storage capacitor Cst together with a storage line 220 and overlaps the storage line 220 with the gate insulating layer 132 dispose there between. The third contact hole 214 penetrating the passivation layer 134 is formed on an overlapping part of the storage line 220 and the source electrode 212, and is connected to the pixel electrode 216.

The image display unit of the TFT substrate having the above-mentioned configuration is formed together with the above-mentioned gate drivers.

A gate metal pattern comprising the gate line 202, the gate electrode 206 and the storage line 220 is formed on the insulating substrate 130 by a first mask process. By a second mask process, the gate insulating layer 132 is formed, and the semiconductor layer 208, on which the active layer 208A formed of an amorphous silicon layer and the ohmic contact layer 208B formed of an n+ amorphous silicon layer are deposited, is formed on the gate insulating layer 132. A source/drain metal pattern comprising the data line 204, the drain electrode 210 and the source electrode 212 are formed by a third mask process. By a fourth mask process, the passivation layer 134 and the third contact hole 214 penetrating the passivation layer 134 are formed. The pixel electrode 216 connected to the source electrode 212 through the third contact hole 214 is formed by a fifth mask process.

The third contact hole 214 is formed in a region corresponding to the diffraction exposure part P3 in which the plurality of slits 156 of the diffraction exposure mask 150 is formed. The third contact hole 214 is formed by the same mask process as the first and second contact holes 110 and 112 of the contact part 120 as described with reference to FIGS. 6 and 7 and is formed in a region corresponding to the diffraction exposure part or half-tone transmission part similar to the first contact hole 110. A photoresist pattern thinner than that of an opaque region P1 is formed on the passivation layer 134 of a portion that is to form the third contact hole 214 by exposure and development using the diffraction exposure mask 150. The thin photoresist pattern is removed by an ashing process after a first dry etching process for forming the internal contact hole 112A of the second contact hole 112, and the third contact hole 214 penetrating only the passivation layer 134 is formed by a second dry etching process. The third contact hole 214 exposing the source electrode 212 is formed by the second dry etching process, where even if the source electrode 212 is formed in a triple-layered structure of Mo/Al/Mo, the upper Mo layer is substantially prevented from being etched. Since the upper Mo layer may be formed to have a thickness less than about 1000 Å and substantially prevent the Al layer from being exposed, a deposition time can be shortened by lowering the deposition thickness of the upper Mo layer to about less than 500 Å, thereby improving productivity. Moreover, since the upper Mo layer of the source electrode 212 of the source/drain metal layer is substantially prevented from being overetched during formation of the third contact hole 214, a defect point of a layer, such as a pin hole, caused by an overetch of the source/drain metal layer is substantially prevented. A short defect capable of connecting the drain electrode 212 to the storage line 220 by the pixel electrode 216 by extending the pinhole of the source/drain metal layer up to the gate insulating layer 132 by the permeation of an etchant is substantially prevented. Even if the contact hole exposing the source/drain metal layer is formed in an overlapping part of the gate metal layer and the source/drain metal layer with the gate insulating layer disposed therebetween, a short defect between the source/drain metal layer and the gate metal layer caused by an overetch of the source/drain metal layer is substantially prevented.

The LCD device and the manufacturing method thereof according to an embodiment of the present invention form the contact hole penetrating the passivation layer and the external hole out of the contact hole penetrating the passivation layer 134 and the gate insulating layer by using the diffraction exposure or half-tone mask, and use the same mask process as the internal hole out of the contact hole penetrating the passivation layer and the gate insulating layer and cause the passivation layer to have a gently sloping surface. The sloping surface of the passivation layer slopes towards the internal hole, wherein the open defect of the bridge electrode through the contact holes is substantially prevented and productivity is improved. Further, since a progressive open defect is substantially prevented, picture quality is improved and the productivity is increased by a fast deposition of the passivation layer.

Furthermore, the LCD device and the manufacturing method thereof according to an embodiment of the present invention form the contact hole penetrating the passivation layer by using the diffraction exposure or half-tone transmission, thereby substantially preventing the source/drain metal layer from being overetched while the contact hole is formed. Even if a triple structure of Mo/Al/Mo is applied to the source/drain metal layer, the upper Mo layer can be deposited to be thin and productivity may be improve due to a decrease in the deposition time of the upper Mo layer. Moreover, a short defect caused by an overetch of the source/drain metal layer is substantially prevented while the contact hole exposing the source/drain metal layer is formed at an overlapping part of the gate metal layer and the source/drain metal layer.

While the invention has been shown and described with reference to embodiments thereof, it will be understood by those skilled in the art that various changes in form and details may be made therein without departing from the spirit and scope of the invention.

What is claimed is:

1. A liquid crystal display device, comprising:
   at least two insulating layers formed on a first conductive layer;
   a second conductive layer formed between the at least two insulating layers;
   a first contact hole penetrating an upper insulating layer of the at least two insulating layers and exposing a portion of the second conductive layer;
   a second contact hole penetrating the at least two insulating layers and exposing a portion of the first conductive layer; and
   a contact part comprising a bridge electrode formed of a third conductive layer to electrically connect the first conductive layer to the second conductive layer through the first and second contact holes,
   wherein the second contact hole comprises an internal hole penetrating the at least two insulating layers and an external hole surrounding the internal hole and formed in the upper insulating layer,
   wherein the internal hole of the second contact hole and the external hole of the second contact hole are separated from each other by a given distance,
   wherein the first contact hole and the external hole of the second contact hole have a gently sloping surface as compared to a sloping surface of the internal hole of the second contact hole.

2. The liquid crystal display device according to claim 1, wherein the external hole of the second contact hole is further extended toward the first contact hole than in another direction.

3. The liquid crystal display device according to claim 2, wherein a sloping surface of the external hole adjacent to the first contact hole is more gently formed than other sloping surfaces of the external hole.

4. The liquid crystal display device according to claim 3, wherein the contact part is formed on a thin film transistor substrate comprising an image display unit consisting of a plurality of subpixels and comprising a driving circuit for driving the image display unit.

5. The liquid crystal display device according to claim 4, wherein the image display unit comprises a pixel electrode formed in a subpixel region, a thin film transistor connected to the pixel electrode, a gate line for controlling the thin film transistor, and a data line for supplying data to the thin film transistor, and wherein the driving circuit comprises a gate driving circuit for driving the gate line.

6. The liquid crystal display device according to claim 5, wherein the first conductive layer comprises a gate metal layer formed on an insulating substrate, the second conductive layer comprises a source/drain metal layer formed on a lower insulating layer of the at least two insulating layers covering the gate metal layer, and the third conductive layer comprises a transparent conductive layer formed on the upper insulating layer covering the source/drain metal layer, wherein the lower insulating layer is a gate insulating layer and the upper insulating layer is a passivation layer.

7. The liquid crystal display device according to claim 6, wherein the source/drain metal layer comprises double metal layers in which at least an aluminum layer and a molybdenum layer are stacked, and the molybdenum layer is connected to the bridge electrode.

8. The liquid crystal display device according to claim 7, wherein the image display unit further comprises a storage line formed of the gate metal layer, and wherein the source electrode that is formed of the source/drain metal layer and is extended from the thin film transistor to overlap the storage line with the gate insulating layer disposed therebetween and is connected to the pixel electrode formed of the transparent conductive layer through a third contact hole penetrating the passivation layer.

* * * * *